United States Patent
Herschbein et al.

(10) Patent No.: US 7,119,333 B2
(45) Date of Patent: Oct. 10, 2006

(54) ION DETECTOR FOR ION BEAM APPLICATIONS

(75) Inventors: Steven B. Herschbein, Hopewell Junction, NY (US); Narender Rana, Albany, NY (US); Chad Rue, Poughkeepsie, NY (US); Michael R. Sievers, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/904,438

(22) Filed: Nov. 10, 2004

(65) Prior Publication Data

US 2006/0097159 A1    May 11, 2006

(51) Int. Cl.
*G01N 23/225* (2006.01)
*H01J 37/00* (2006.01)

(52) U.S. Cl. .................. 250/309; 250/397; 250/492.21
(58) Field of Classification Search ................. 250/309
See application file for complete search history.

(56) References Cited

U.S. PATENT DOCUMENTS

| | | | |
|---|---|---|---|
| 3,898,456 A * | 8/1975 | Dietz | ......................... 250/299 |
| 5,434,422 A | 7/1995 | Iwamoto et al. | |
| 5,635,836 A | 6/1997 | Kirtley et al. | |
| 5,922,179 A | 7/1999 | Mitro et al. | |
| 6,365,905 B1 | 4/2002 | Koyama et al. | |
| 6,407,850 B1 | 6/2002 | Rojo et al. | |
| 6,501,077 B1 * | 12/2002 | Sawahata et al. | ........... 250/310 |
| 6,787,772 B1 * | 9/2004 | Ose et al. | ................... 250/310 |
| 6,885,001 B1 * | 4/2005 | Ose et al. | ................... 250/310 |
| 2002/0005492 A1 | 1/2002 | Hashikawa et al. | |
| 2002/0050565 A1 | 5/2002 | Tokuda et al. | |
| 2004/0060904 A1 | 4/2004 | Herschbein et al. | |
| 2004/0112857 A1 | 6/2004 | Herschbein et al. | |
| 2004/0129879 A1 | 7/2004 | Furiki et al. | |
| 2004/0132287 A1 | 7/2004 | Fischer et al. | |

OTHER PUBLICATIONS

Students abstracts: LBNL—Materials Sciences, "Student Abstracts: Materials Sciences at LBNL", http://www.scied.science.doe.gov/scied/Abstracts2003/LBNLms.htm, 2 pages.
Training Courses 2004, FEI Company, Scanning Electron Microscopy, Small Dualbeam and Applications, 17 Pages.
SEM Substages and SPM Accessories from Ernest F. Fullam, Inc., 7 pages, http:www.fullam.com/Sem_subs.htm, "SEM SUBSTAGES".

* cited by examiner

*Primary Examiner*—David A. Vanore
(74) *Attorney, Agent, or Firm*—Lisa U. Jaklitsch

(57) ABSTRACT

Detection of weak ion currents scattered from a sample by an ion beam is improved by the use of a multiplier system in which a conversion electrode converts incident ions to a number of secondary electrons multiplied by a multiplication factor, the secondary electrons being attracted to an electron detector by an appropriate bias. In one version, the detector is a two stage system, in which the secondary electrons strike a scintillator that emits photons that are detected in a photon detector such as a photomultiplier or a CCD.

20 Claims, 3 Drawing Sheets

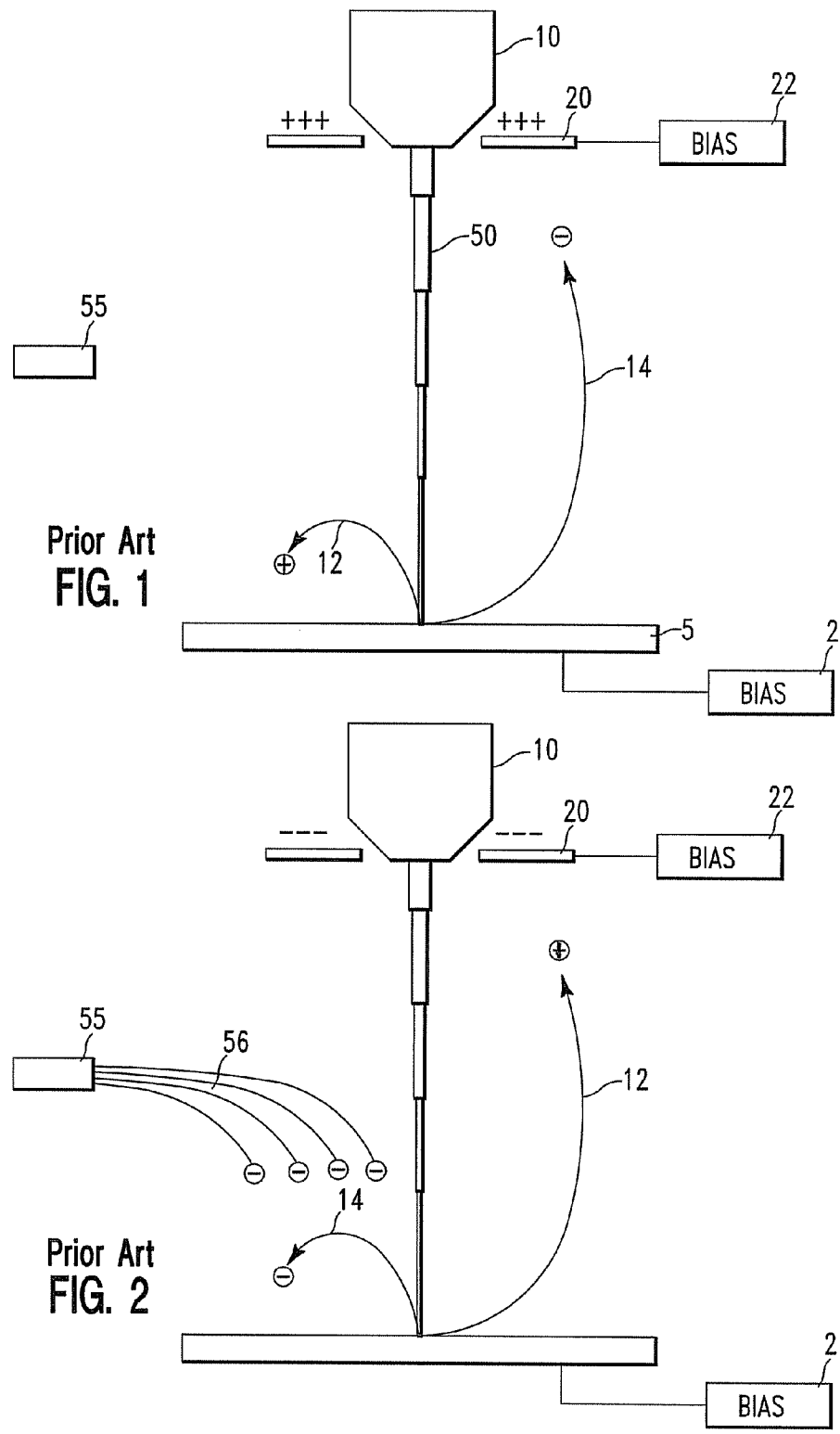

ION DETECTOR FOR ION BEAM APPLICATIONS

TECHNICAL FIELD

The field of the invention is that of focused ion beam tools.

BACKGROUND OF THE INVENTION

Existing Technology and Problems Encountered

Focused Ion Beam (FIB) tools produce a focused, energetic beam of positively charged ions (subsequently referred to as the primary ion beam or primary ions), which can be used to image or alter microscopic structures. When the primary ion beam is scanned over the surface of the sample, an assortment of secondary particles is sputtered from the surface: electrons, ions, and neutrals.

In commercial FIB tools, a portion of the charged secondary particles is diverted to a detector, usually a microchannel plate (MCP) or scintillator-type detector, where the signal is amplified and measured. To create an image, the measured secondary signal intensity is converted to a greyscale color and displayed on a screen.

When an MCP detector is used, two imaging modes are generally available, depending on which secondary particle is being detected. In electron mode a positive voltage is applied to the MCP to attract secondary electrons (secondary ions are repelled by the MCP and are not collected). In ion mode, the MCP is biased negative to collect secondary ions (secondary electrons are repelled by the MCP and are not collected).

FIG. 1 illustrates the operation of a typical FIB tool in electron mode. FIB tool 10, schematically representing the ion source, focusing optics and deflection coils that scan the beam over workpiece (or sample) 5, generates ion beam 50. Beam 50 strikes a point on the workpiece and generates electrons 14 and secondary ions 12.

The detector 20 is biased positive with respect to the workpiece by bias source 22 to attract electrons (and thereby repel the secondary ions). Detector 20 may be a conventional microchannel plate or any other charged particle detection system. Workpiece 5 is optionally biased at a convenient value.

On the left of the figure, electron source 55 is available to generate electrons that can neutralize charge buildup on the workpiece. This is not used during electron mode.

FIG. 2 illustrates the other standard mode, ion mode, in which detector 20 is biased negative with respect to the workpiece, so that secondary ions are attracted to the detector.

The beam consists of positively charged ions, and therefore a net positive charge accumulates on the workpiece during FIB processing. The buildup of positive charge at various locations within the workpiece can result in damage due to electrostatic discharge (ESD). To prevent ESD damage, a current of electrons may be directed at the workpiece to neutralize such a buildup. In this case, electron source 55, referred to as a flood gun, directs a flood of electrons at workpiece 5 to neutralize charge buildup.

Ion mode has some special advantages over electron mode. It typically has better sensitivity to differences in material composition compared to electron mode. Additionally, ion mode can be used while simultaneously exposing the sample surface to a flood of electrons to neutralize the build-up of positive charge from the primary beam. Electron mode, by contrast, cannot be used during charge neutralization because the flood electrons would be attracted to the MCP and would swamp the secondary electron signal.

For samples that could be damaged by charge build-up from the primary beam, ion mode is essential.

One serious limitation of ion mode, however, is total signal intensity. The number of secondary ions generated by the primary beam is significantly lower than the number of secondary electrons, so the signal-to-noise ratio of ion mode is poor compared to electron mode. In particular, when the primary beam is small (below about 20 pA), the number of secondary ions is so low that ion mode becomes impractical.

Nevertheless, in the semiconductor industry there is growing concern over beam-induced charge damage. Modern integrated circuits (ICs) have smaller and more delicate features, new types of construction (such as SOI), and new materials (such as low-k dielectrics). All of these factors make modern ICs more susceptible to charge damage, so it is necessary to keep beam currents low and use charge neutralization during FIB processing.

Clearly, some means of improving the existing ion detection scheme would enhance the capabilities of the FIB technique.

SUMMARY OF THE INVENTION

The invention relates to a focused ion beam apparatus that employs a charge (signal) magnification technique to improve the net detected signal in ion mode.

A feature of the invention is that secondary ions are attracted to a multiplier electrode that emits on average more than one electron for each secondary ion that strikes it.

Another feature of the invention is that electrons emitted from the multiplier electrode are collected by a detector, thereby increasing the amount of the detected signal.

Another feature of the invention is that electrons emitted from the multiplier electrode are attracted to a scintillator that emits one or more photon on average in response to each secondary electron that strikes it.

Yet another feature of the invention is that a beam of photons passes through the secondary plume of particles, ionizing at least some neutral atoms that are sputtered off the workpiece.

BRIEF DESCRIPTION OF THE DRAWINGS

FIG. 1 illustrates in partial cross section, partial schematic fashion a prior art FIB system operating in electron mode.

FIG. 2 illustrates in partial cross section, partial schematic fashion a prior art FIB system operating in ion mode.

DETAILED DESCRIPTION

Figure 3:
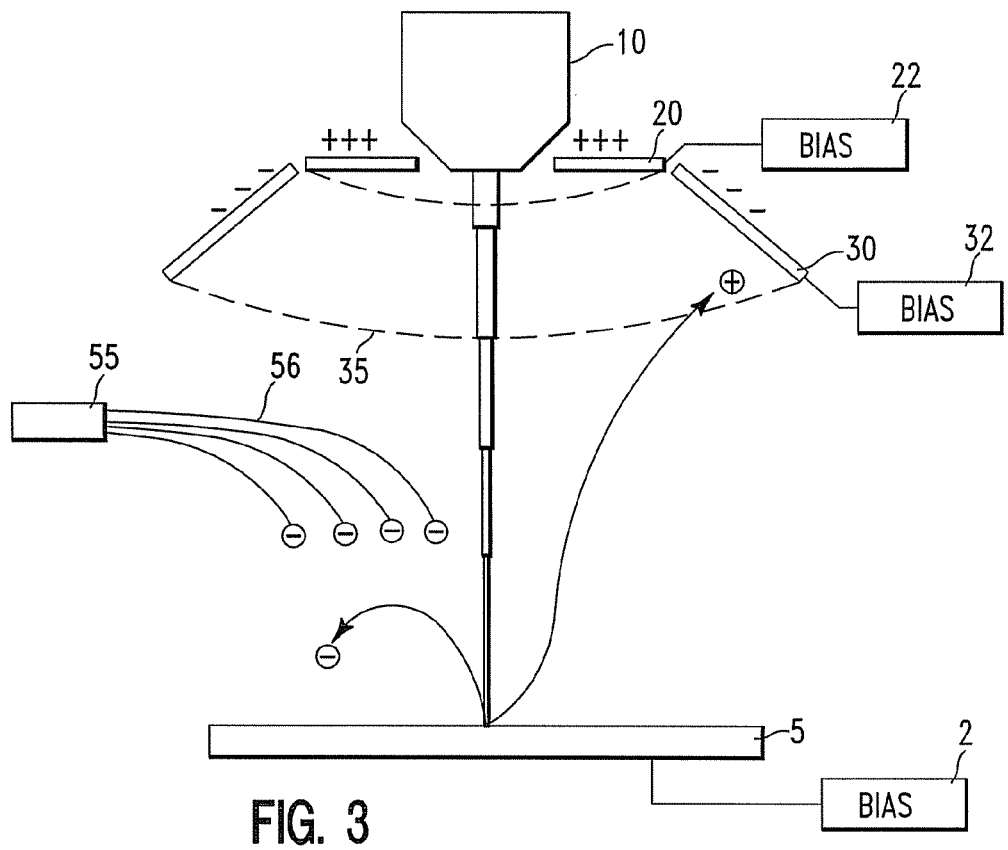
FIG. 3 illustrates in partially pictorial, partially schematic fashion a first embodiment of the invention.

FIG. 3 illustrates in cross section a version of the invention that includes the addition of a conversion dynode 30 to the FIB detector hardware. The conversion dynode is preferably in the shape of a frustum of a cone (which may have a non-metallic coating) that extends azimuthally about the primary beam 50 and is located near the MCP. Dashed lines 35 indicate the path of the front portion of the dynode 30. In a conventional cross section, lines 35 would have gone straight across, but that would have blocked the MCP. Instead, for improved clarity in presentation, the front portion of the figure, in front of the plane of the cross section, is shown pictorially.

The material of the dynode has a low work function so that electrons are easily released. Commercially available photomultipliers use coatings on multiplier electrodes that are suitable.

FIG. 3 indicates the operation of the system in ion mode, with electron source 55 generating electrons to neutralize residual positive charge on the sample.

Figure 4:
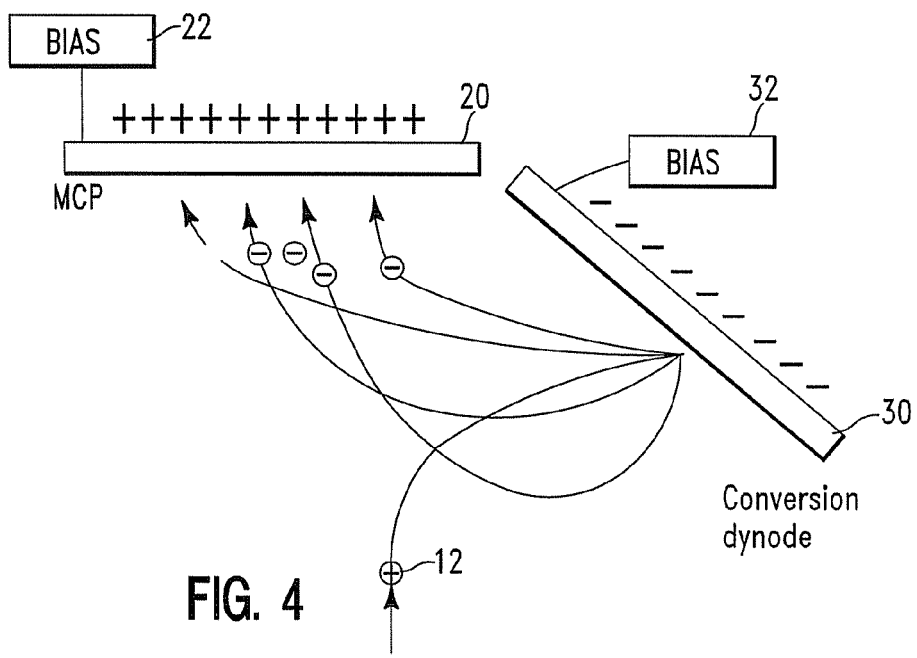
FIG. 4 illustrates a detail of the embodiment of FIG. 3.

The conversion dynode 30 is biased negative relative to the sample by supply 32, while the MCP is biased positive relative to the conversion dynode (though not necessarily positive relative to the sample) by supply 22. Secondary ions generated at the surface of sample 5 by the primary beam will therefore be attracted to and accelerated towards the conversion dynode. When the ions impact the conversion dynode, they will generate secondary electrons from the dynode surface, as shown in FIG. 4. These secondary electrons will be attracted to the MCP, where they will be collected and detected, thus increasing the total current in the detector.

FIG. 4 illustrates a detail of the system of FIG. 3, showing electrode 30, biased to attract ions 12, emitting a number of secondary electrons that are attracted to detector 20 by the relatively positive bias between the two.

The number of secondary electrons generated at the dynode per incoming ion depends on numerous factors, including the bias of the dynode, the charge and mass of the ion, and the surface composition of the dynode. These factors can be tailored to maximize the number of electrons liberated per incident ion, providing an initial amplification of the available signal prior to reaching the FIB's main MCP detector.

An illustrative embodiment is shown in FIG. 3, with the addition of the conversion dynode to the existing FIB hardware, but other configurations are also possible.

Figure 5:
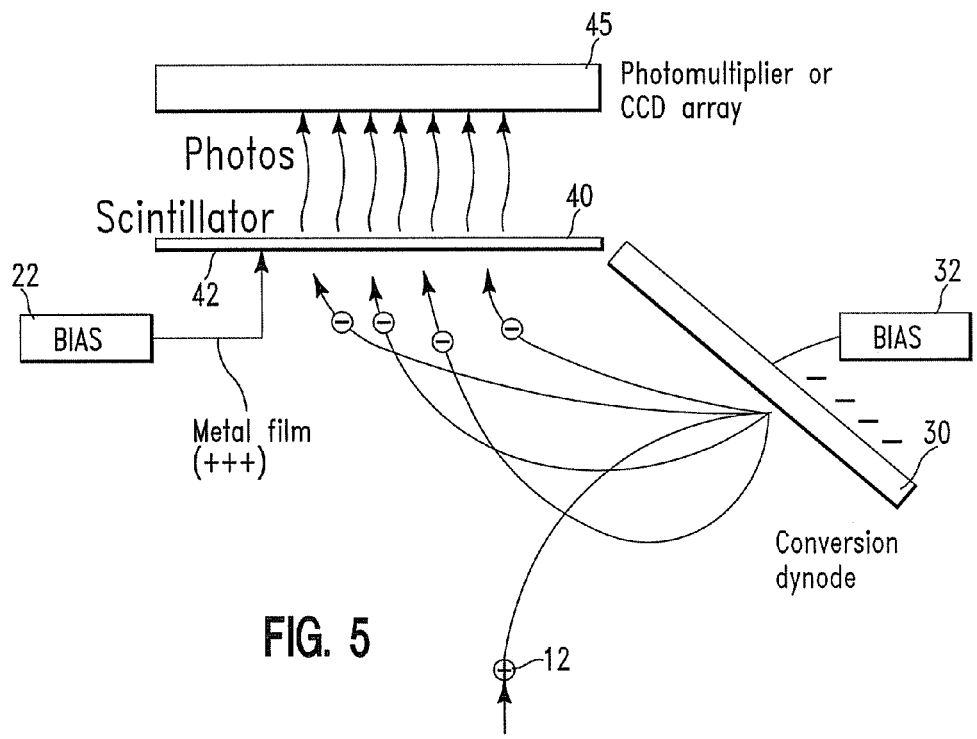
FIG. 5 illustrates a detail of an alternative embodiment of the invention.

One variant of the invention is to replace the MCP with a scintillator/photomultiplier or scintillator/CCD detector, as shown in FIG. 5. A thin metal coating 42 on the scintillator film allows a bias voltage to be applied to attract electrons, while being thin enough to allow them to pass through to the scintillator film on the other side. When the electrons strike the scintillator film 40, photons are emitted, which are then detected by a photomultiplier or a CCD array 45. The advantage of this particular arrangement, though physically more complicated than that depicted in FIG. 4, is that on average each electron striking the scintillator film generates multiple photons. Thus, the signal is further amplified.

Scintillator-type detectors are currently available from some FIB manufacturers. However, these devices are not suitable for ion detection, because the thin metal films are susceptible to damage from the incident ions. The conversion dynode/scintillator combination shown in FIG. 5 allows ions to be detected indirectly without damage to the scintillator, because the ions are repelled by the bias on the film 42 and first converted to electrons at the conversion dynode.

Figure 6:
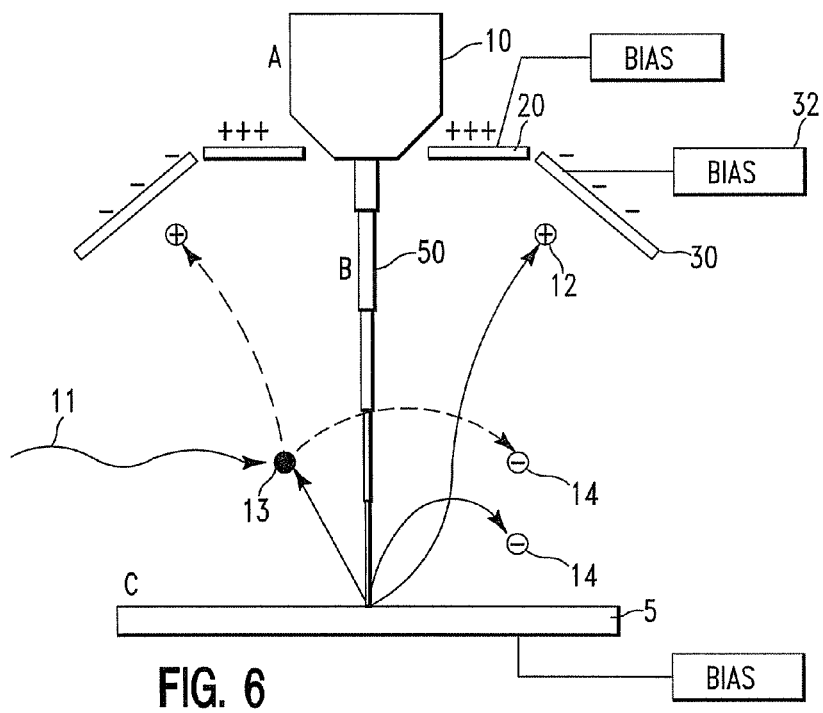
FIG. 6 illustrates another embodiment of the invention in which neutral particles are ionized.

Another embodiment includes the addition of ionizing electromagnetic radiation, as depicted in FIG. 6. In this configuration, a beam of ionizing radiation in the form of visible, UV, or X-ray photons is directed near the sample surface to intercept neutral particles sputtered by the primary beam. The photons should not strike the surface of sample 5, which could potentially damage the sample surface and/or interfere with the geometric data provided by the location of beam 50 on the surface of the sample. Because neutrals comprise the bulk of the ejected secondary plume, this method of ionization to harvest these otherwise discarded particles can provide a significant increase in signal, even if the fraction of neutrals ionized is relatively low, especially when combined with the conversion dynode described above.

Another alternative embodiment of the invention is to adjust the geometries and voltages of the MCP and conversion dynode to simultaneously attract all charged particles. In this case, the MCP is biased positive relative to the sample (to attract electrons), and the conversion dynode is biased negative relative to the sample (to attract positive ions). Photoionization of neutral particles creates positive ions and electrons, which are in turn be attracted to the conversion dynode and MCP, respectively. This embodiment can be considered a universal detector because it has the ability to attract and detect all of the major components of the secondary plume. Note that ultimately, all of the secondary particles are converted to electrons and detected at the MCP.

The above discussion has been illustrated with respect to the FIB technique for convenience, but the invention can also be applied to other techniques in which ions must be detected, including Secondary Ion Mass Spectrometry (SIMS) and Time-Of-Flight (TOF) mass spectrometry. In each case, a low-current beam of ions strikes an electrode that emits on average more than one secondary electron per incident ion. The secondary electrons are then detected, either in a single stage, as in FIG. 4 or in a two-stage process that employs a second conversion of the secondary electrons to photons as in FIG. 5.

While the invention has been described in terms of a limited number of preferred embodiments, those skilled in the art will recognize that the invention can be practiced in various versions within the spirit and scope of the following claims.

What is claimed is:

1. An ion beam system comprising:
   a beam generator for generating and directing a primary ion beam at a sample;
   at least one detector for detecting secondary particles scattered from said sample by said primary ion beam;
   a conversion electrode disposed azimuthally about said detector so as to receive ions scattered from said sample, said conversion electrode being adapted to emit more than one secondary electron for each ion striking it, the number of secondary electrons being related to the number of incident ions by a multiplication factor; in which
   said conversion electrode is biased negative with respect to a bias of said sample and said detector is biased positive with respect to said conversion electrode, whereby a first number of ions scattered from said sample and received by said conversion electrode emits said first number multiplied by said multiplication factor of secondary electrons that are attracted to said detector.

2. A system according to claim 1, in which:
   said detector is disposed azimuthally about said primary beam.

3. A system according to claim 1, in which:
   said conversion electrode has the shape of a frustrum of a cone centered on said primary beam.

4. A system according to claim 1, in which:
   said detector is an electrical detector that generates an electrical signal in response to an electron striking it.

5. A system according to claim 4, in which:
said detector is disposed azimuthally about said primary beam.

6. A system according to claim 4, in which:
said conversion electrode has the shape of a frustrum of a cone centered on said primary beam.

7. A system according to claim 1, in which:
said detector is a two stage detector comprising a scintillator material that emits photons in response to an electron striking it and a photodetector that generates an electrical signal in response to said photons.

8. A system according to claim 7, in which:
said detector comprises a layer of conductive material on a front surface of said scintillator, whereby a positive bias with respect to said conversion electrode applied to said conductive material attracts said secondary electrons to said scintillator.

9. An ion beam system comprising:
a beam generator for generating and directing a primary ion beam at a sample;
at least one detector for detecting secondary particles scattered from said sample by said primary ion beam;
a conversion electrode disposed to receive ions scattered from said sample, said conversion electrode being adapted to emit more than one secondary electron for each ion striking it, the number of secondary electrons being related to the number of incident ions by a multiplication factor; in which
said conversion electrode is biased negative with respect to a bias of said sample and said detector is biased positive with respect to said conversion electrode, whereby a first number of ions scattered from said sample and received by said conversion electrode emits said first number multiplied by said multiplication factor of secondary electrons that are attracted to said detector; and
a source of ionizing photons that are directed through a plume of secondary particles scattered from said sample, whereby at least some neutral particles in said plume of secondary particles are ionized.

10. A system according to claim 9, in which:
said detector is an electrical detector that generates an electrical signal in response to an electron striking it.

11. A system according to claim 10, in which:
said detector is disposed azimuthally about said primary beam and said conversion electrode is disposed azimuthally about said detector.

12. A system according to claim 10, in which:
said conversion electrode has the shape of a frustrum of a cone centered on said primary beam.

13. A system according to claim 9, in which:
said detector is a two stage detector comprising a scintillator material that emits photons in response to an electron striking it and a photodetector that generates an electrical signal in response to said photons.

14. A system according to claim 13, in which:
said detector comprises a layer of conductive material on a front surface of said scintillator, whereby a positive bias with respect to said conversion electrode applied to said conductive material attracts said secondary electrons to said scintillator.

15. A system for detecting a beam of ions comprising:
at least one detector for detecting electrons;
a conversion electrode disposed azimuthally about said detector so as to receive said beam of ions, said conversion electrode being adapted to emit more than one secondary electron for each ion striking it, the number of secondary electrons being related to the number of incident ions by a multiplication factor; in which said conversion electrode is biased to attract said beam of ions and said detector is biased positive with respect to said conversion electrode, whereby a first number of ions received by said conversion electrode emits said first number multiplied by said multiplication factor of secondary electrons that are attracted to said detector.

16. A system according to claim 15, in which:
said detector is an electrical detector that generates an electrical signal in response to an electron striking it.

17. A system according to claim 15, in which:
said detector is a two stage detector comprising a scintillator material that emits photons in response to an electron striking it and a photodetector that generates an electrical signal in response to said photons.

18. A system according to claim 15, in which:
said detector is a two stage detector comprising a scintillator material that emits photons in response to an electron striking it and a photodetector that generates an electrical signal in response to said photons.

19. A system according to claim 15, in which:
said detector is disposed azimuthally about said primary beam.

20. A system according to claim 15, in which:
said conversion electrode has the shape of a frustrum of a cone centered on said primary beam.

* * * * *